United States Patent
Ohgoh (10) Patent No.: US 7,928,453 B2
(45) Date of Patent: Apr. 19, 2011

(54) SEMICONDUCTOR LIGHT EMITTING DEVICE

(75) Inventor: Tsuyoshi Ohgoh, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 209 days.

(21) Appl. No.: 12/212,176

(22) Filed: Sep. 17, 2008

(65) Prior Publication Data

US 2009/0078947 A1 Mar. 26, 2009

(30) Foreign Application Priority Data

Sep. 20, 2007 (JP) ................... 2007-243752

(51) Int. Cl.
*H01L 33/00* (2010.01)

(52) U.S. Cl. ................... 257/96; 257/E33.027

(58) Field of Classification Search ............ 257/79, 257/95, 96

See application file for complete search history.

(56) References Cited

U.S. PATENT DOCUMENTS

| 4,943,970 | A | * | 7/1990 | Bradley | ............... 372/45.01 |
| 5,329,135 | A | * | 7/1994 | Terakado | ............... 257/17 |
| 6,541,291 | B2 | | 4/2003 | Kuniyasu | |
| 6,859,478 | B2 | * | 2/2005 | Kuniyasu | ............... 372/45.01 |
| 6,914,262 | B2 | * | 7/2005 | Hahm et al. | ............... 257/79 |
| 7,528,403 | B1 | * | 5/2009 | Borselli et al. | ............... 257/25 |
| 7,759,690 | B2 | * | 7/2010 | Miki et al. | ............... 257/97 |

FOREIGN PATENT DOCUMENTS

JP 2000-031596 A 1/2000

* cited by examiner

*Primary Examiner* — Thao P. Le (74) *Attorney, Agent, or Firm* — Sughrue Mion, PLLC

(57) ABSTRACT

An end face emission type semiconductor light emitting device which include: a substrate; a first conductive type clad layer stacked on the substrate; an active region layer including an active layer stacked on the first conductive type clad layer; a second conductive type clad layer stacked on the active region layer such that a thickness of a portion thereof at least over an emission region of the active region layer in an emission end face adjacent area is thinner than a thickness of the other portion; and a second conductive type regrowth layer stacked on the second conductive type clad layer, which has a higher refractive index than the second conductive type clad layer.

4 Claims, 5 Drawing Sheets

SEMICONDUCTOR LIGHT EMITTING DEVICE

BACKGROUND OF THE INVENTION

1. Field of the Invention

The present invention relates to a semiconductor light emitting device and a manufacturing method thereof, and more specifically to a structure capable of preventing end face damage in semiconductor light emitting devices.

2. Description of the Related Art

Many surface states are present on a resonator end face of a semiconductor laser obtained by cleavage, and the temperature is increased by non-emission recombination of carriers. Consequently, the temperature of a portion adjacent to the end face becomes higher than that of the inner portion of the resonator, causing reduction of the band gap adjacent to the end face and self absorption of laser light. As the result, a positive feedback in temperature occurs in which the temperature is further increased. In the end, the temperature of the end face reaches the melting point of the material, leading to physical destruction and laser output degradation, which is known as COMD (Catastrophic Optical Mirror Damage). As for the methods of preventing such end face destruction, the following are generally known: (1) A method of using a structure (window structure) that prevents self absorption of laser light by increasing the band gap energy adjacent to the end face and (2) a method of decreasing peak optical density of the active layer by increasing the beam spot diameter of laser.

One of the specific methods of the type (1) described above is proposed as described, for example, in Japanese Unexamined Patent Publication No. 2000-031596 in which a window structure is formed by etching the upper clad layer to the vicinity of the quantum well active layer adjacent to the emission end face and forming a regrowth layer doped with the same dopant as that of the upper clad layer to diffuse the dopant into the quantum well layer and crystallize.

Another method is proposed as described, for example, in U.S. Pat. Nos. 6,541,291 and 6,859,478 in which a window structure is formed by removing the active layer including quantum wells adjacent to the emission end face and filling a material therein having a greater band gap than the quantum well layer, and further diffusing a dopant into the quantum well active layer.

In the mean time, one of the specific methods of the type (2) described above is to increase the beam spot diameter of laser by employing a broad area structure in which the emission region is broadened in the parallel direction with respect to the p-n junction face, and a broad guide structure in which the emission region is broadened in the orthogonal direction with respect to the p-n junction face. The broad area structure is a structure in which the width of current injection stripe is broadened, which is generally known as a method for increasing the output power of a semiconductor laser. In the broad guide structure, the beam spot diameter is increased by increasing the thickness of the light guide layer in SCH structure. In either case, peak optical density of the active layer is decreased by increasing the light spot diameter of laser.

The window structure described in Japanese Unexamined Patent Publication No. 2000-031596, however, poses a problem that reproducibility of device characteristics is poor, since it uses thermal diffusion. The window structure described in U.S. Pat. Nos. 6,541,291 and 6,859,478 poses a problem that device characteristics are degraded, since a portion of the quantum well layer needs to be removed.

In the mean time, in the broad area structure of the type (2), the increased stripe width causes transverse higher order mode oscillation and filament oscillation to be more likely to occur, which poses a problem that uniform oscillation over the entire region is difficult. In the case of broad guide structure, a change in the light guide layer causes the beam profile (NFP, FFP) to be changed and the current threshold value, slope efficiency, and the like are influenced greatly by this, which poses a problem of limiting design flexibility.

In view of the circumstances described above, it is an object of the present invention to provide a semiconductor light emitting device capable of high output operation with high reliability. It is a further object of the present invention to provide a manufacturing method of semiconductor light emitting device having high reproducibility.

SUMMARY OF THE INVENTION

A semiconductor light emitting device according to the present invention is an end face emission type semiconductor light emitting device including;

a substrate;

a first conductive type clad layer stacked on the substrate;

an active region layer including an active layer stacked on the first conductive type clad layer;

a second conductive type clad layer stacked on the active region layer such that a thickness of a portion thereof at least over an emission region of the active region layer in an emission end face adjacent area is thinner than a thickness of the other portion; and a second conductive type regrowth layer stacked on the second conductive type clad layer, the regrowth layer having a higher refractive index than the second conductive type clad layer.

Another semiconductor light emitting device according to the present invention is an end face emission type semiconductor light emitting device including;

a substrate;

a first conductive type clad layer stacked on the substrate;

an active region layer including an active layer stacked on the first conductive type clad layer;

a second conductive type clad layer stacked on the active region layer other than on a portion at least over an emission region thereof in an emission end face adjacent area; and a second conductive type regrowth layer stacked on the second conductive type clad layer and on the portion of the active region layer where the second conductive type clad layer is not stacked, the regrowth layer having a higher refractive index than the second conductive type clad layer.

That is, the feature of the semiconductor light emitting devices of the present invention is that a thickness of a portion of the second conductive type clad layer at least over an emission region of the active region layer in an emission end face adjacent area is made thinner or the clad layer is not stacked on a portion of the active region layer at least over an emission region of the active region layer in an emission end face adjacent area, whereby the regrowth layer is disposed closer to the active layer in the portion than in the other portion.

In the semiconductor light emitting devices described above, it is preferable that the substrate is formed of GaAs; the first conductive type clad layer is formed of $(Al_{x1}Ga_{1-x1})_{z1}In_{1-z1}P$ ($0 \leq x1 \leq 0.7$) or $Al_{x2}Ga_{1-x2}As$; the active region layer includes, in the order from the side of the first conductive type clad layer, a non-doped or first conductive type $In_{x3}Ga_{1-x3}As_{1-y3}P_{y3}$ light guide layer ($0 \leq x3 \leq 0.3$), an $In_{x4}Ga_{1-x4}As_{1-y4}P_{y4}$ active layer ($0 \leq x4 \leq 0.4$, $0 \leq y4 \leq 0.1$), and a non-doped or second conductive type $In_{x5}Ga_{1-x5}As_{1-y5}P_{y5}$ light guide layer ($0 \leq x5 \leq 0.3$); the second conductive type clad layer is formed of $(Al_{x1}Ga_{1-x1})_{z2}In_{1-z2}P$ ($0 \leq x1 \leq 0.7$) or $Al_{x6}Ga_{1-x6}As$; and the second conductive type regrowth layer is formed of $Al_{x7}Ga_{1-x7}As$ with an element ratio selected to have a higher refractive index than that of the second conductive type clad layer.

The manufacturing method of a semiconductor light emitting device according to the present invention is a manufacturing method of an end face emission type semiconductor light emitting device, including:

a first step of stacking semiconductor layers, including the following in the order listed below, on a substrate, a first conductive type clad layer, an active region layer including an active layer, and a second conductive type clad layer;

a second step of using a mask having an opening over a portion of the active region layer including at least an emission region thereof in an emission end face adjacent area to remove all or part of the second conductive type clad layer from the portion of the active region layer; and a third step of stacking a regrowth layer on the second conductive type clad layer, or on the second conductive type clad layer and on the portion of the active region layer where the second conductive type clad layer is not stacked, the regrowth layer having a higher refractive index than the second conductive type clad layer.

In the semiconductor light emitting devices and the manufacturing method thereof, another layer such as a buffer layer, etching stop layer, or the like, may be inserted between each of the stacked layers described above. Note that each layer is formed with an elemental ratio and a thickness so as not to exceed the critical thickness. Also, note that where the range of a suffix indicating the ratio of an element includes 0, it means that the composition does not include the element. For example, in a layer of $(Al_{x1}Ga_{1-x1})_{z1}In_{1-z1}P$ ($0 \leq x1 \leq 0.7$), if x1 is 0, it becomes a $Ga_{z1}In_{1-z1}P$ layer.

In the description above, the term "emission end face adjacent area" as used herein means an area extending from the emission end face to inward of the device by a predetermined distance.

Further, in the description above, the terms "first conductive type and second conductive type" mean to indicate opposite polarities to each other. If the first conductive type is n-type, then the second conductive type is n-type, and if the first conductive type is p-type, then the second conductive type is n-type.

In the semiconductor light emitting devices of the present invention, the regrowth layer is disposed closer to the active layer on a portion of the active region layer at least over an emission region thereof than on the other portion. This allows the beam spot diameter on the emission end face to be made larger than the internal beam diameter of the device, whereby the device may provide the advantageous effect of decreasing the optical power density on the emission end face identical to that of a device having a window structure formed by diffusing a dopant into the active layer in an emission end face adjacent area described under the section "Description of the Related Art". The decrease in the optical power density may prevent COMD, resulting in increased reliability to higher output in comparison with a conventional device in which the second conductive type clad layer is provided uniformly over the active region.

Figure 1:
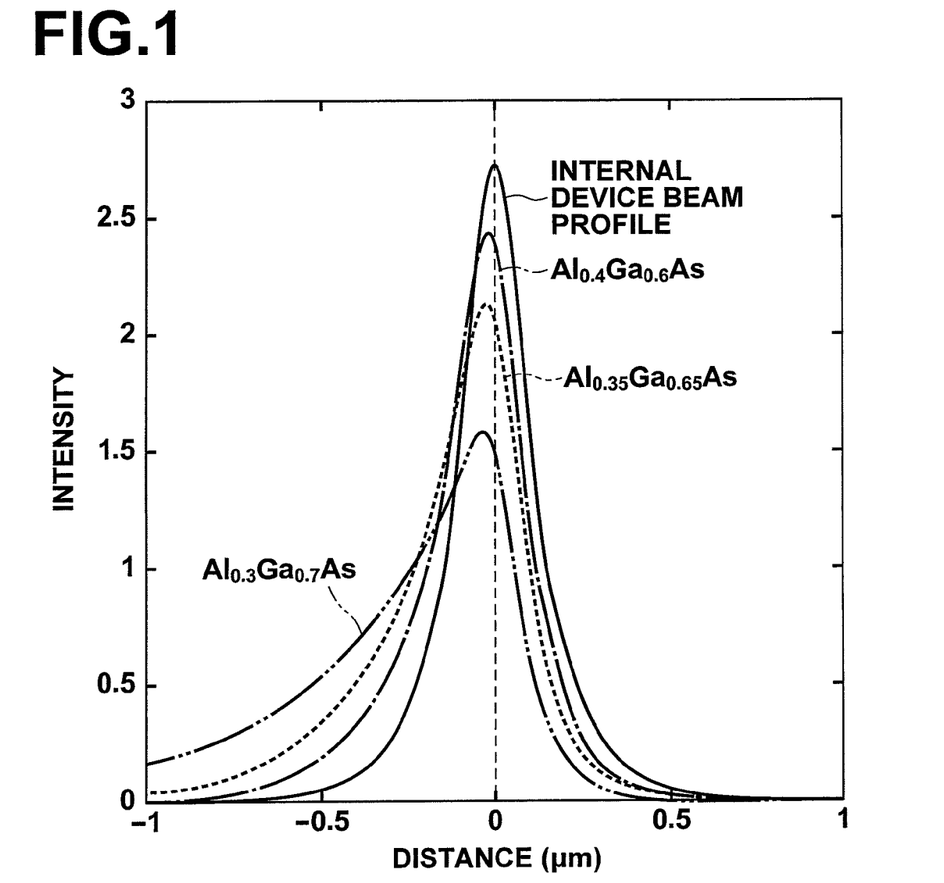
FIG. 1 illustrates advantageous effects of the present invention.

FIG. 1 illustrates beam profiles of semiconductor light emitting devices which do not have a second conductive type clad layer in the emission end face adjacent area and has a regrowth layer formed of $Al_{x6}Ga_{1-x6}As$ in the area, like the one shown in FIG. 2D and to be described later. The semiconductor light emitting devices further include an InGaAs quantum well active layer (wavelength of 1.0 μm, thickness of 70 Å), GaAs light guide layers (each with a thickness of 660 Å), and GaInP clad layers (each with a thickness of 2.0 μm), with Al ratio x6 in the $Al_{x6}Ga_{1-x6}As$ regrowth layer of 0.4, 0.35, and 0.3 respectively (each having higher refractive index than the GaInP layers at a wavelength of 1.0 μm). In the graph, the solid line indicates an internal device beam profile inner than the emission end face adjacent area. The chain line, dashed line, and two-dot chain line indicate beam profiles on the emission end face of the devices with Al ratios of 0.4, 0.35, and 0.3 respectively.

In FIG. 1, the point of 0 in the horizontal axis corresponds to the center position of the quantum well active layer in the thickness direction, and the horizontal axis represents the distance in the thickness direction from the center position of the quantum well active layer in the thickness direction. In the $Al_{x6}Ga_{1-x6}As$ layer, the refractive index becomes higher as the Al ratio x6 decreases, which decreases the equivalent refractive index in the active layer. The graph of FIG. 1 shows that in the device of the present invention without the second conductive type clad layer in the emission end face adjacent area, the optical power density on the emission end face is decreased with respect to the optical power density inside of the device. Here, it shows in particular that the higher the refractive index in the regrowth layer, the grater the reduction effect of optical power density. Thus, it is clear that in the semiconductor light emitting devices of the present invention, the beam diameter on the emission end face may be increased greater than the interior beam diameter and optical power density on the emission end face may be decreased.

According to the manufacturing method of a semiconductor light emitting device of the present invention, a device capable of high output operation with high reproducibility and reliability may be manufactured with high repeatability, since dopant diffusion and etching removal of active layer performed when forming a window structure in the past is not required.

As described in Japanese Unexamined Patent Publication No. 2000-031596 and U.S. Pat. Nos. 6,541,291 and 6,859,478 described under the section "Description of the Related Art", when manufacturing a device having a window structure, a step of diffusing a dopant into the active layer is required, while the manufacturing method of the present invention does not require such step, so that the manufacturing process may be simplified.

DESCRIPTION OF THE PREFERRED EMBODIMENTS

Hereinafter, the semiconductor light emitting device according to a first embodiment will be described in detail with reference to FIGS. 2A to 2D. FIGS. 2A to 2D are perspective views of the semiconductor light emitting device of the present invention, illustrating a manufacturing process thereof.

These structures may be stacked using metal organic chemical vapor deposition (MOCVD) method or the like. In the case of MOCVD method, TEG (triethylgallium), TMA (triethylaluminum), TMI (triethylindium), $AsH_3$ (arsine), $PH_3$ (phosphine), and the like are used as the material, and $SiH_4$ (silane), DEZ (diethylzinc), $Cp_2Mg$ and the like are used as the dopant.

FIGS. 2A to 2D are perspective views of the semiconductor light emitting device, illustrating a manufacturing process thereof. The semiconductor is stacked on a wafer and made into a chip by cleavage at the end, but FIGS. 2A to 2D illustrate the semiconductor in a shape after made into a chip for the convenience of explanation.

Figure 2A:
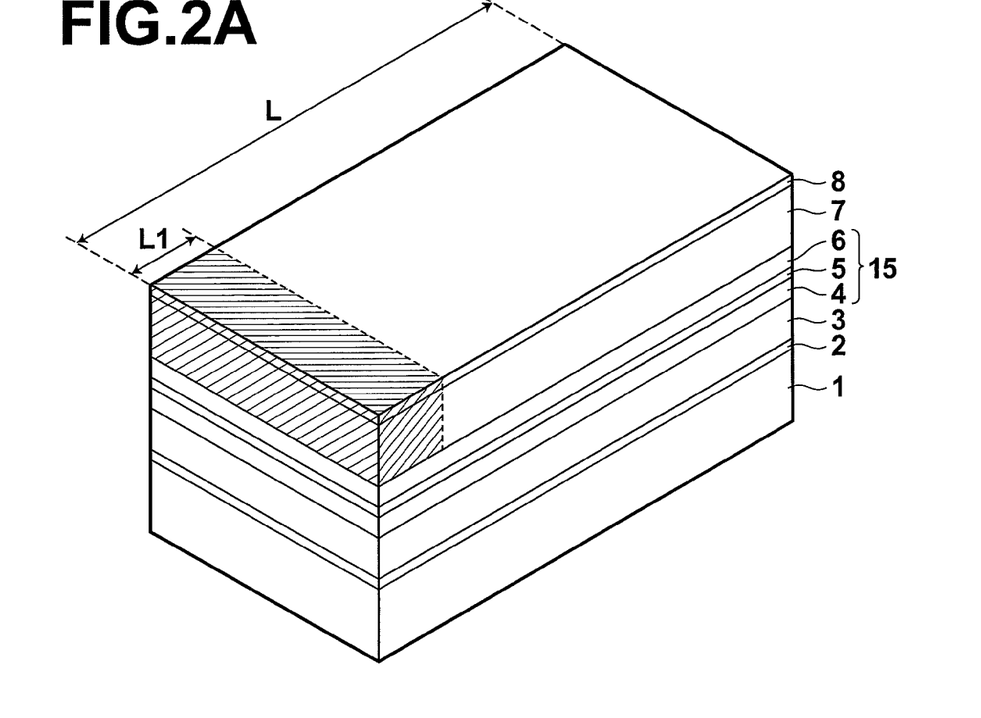
FIG. 2A is a perspective view of the semiconductor light emitting device according to a first embodiment, illustrating a manufacturing process thereof (part 1).

As illustrated in FIG. 2A, the following layers are stackingly disposed on a first conductive type GaAs substrate (wafer) 1 in the order listed below by a first crystal growth (first step): a first conductive type GaAs buffer layer 2; a first conductive type $(Al_{x1}Ga_{1-x1})_zIn_{1-z}P$ ($0 \leq x1 \leq 0.7$) or $Al_{x2}Ga_{1-x2}As$ clad layer 3; a non-doped or first conductive type $In_{x3}Ga_{1-x3}As_{1-y3}P_{y3}$ (x3=0.49y3, $0 \leq x3 \leq 0.3$) light guide layer 4; an $In_{x4}Ga_{1-x4}As_{1-y4}P_{y4}$ ($0 \leq x4 \leq 0.4$, $0 \leq y4 \leq 0.1$) active layer 5; a non-doped or a second conductive type $In_{x5}Ga_{1-x5}As_{1-y5}P_{y5}$ (x5=0.49y5, $0 \leq x5 \leq 0.3$) light guide layer 6; a second conductive type $(Al_{x1}Ga_{1-x1})_zIn_{1-z}P$ ($0 \leq x1 \leq 0.7$) or $Al_{x6}Ga_{1-x6}As$ clad layer 7; and a second conductive type cap layer 8. Here, the cap layer 8 is provided so that an entire surface on which a regrowth layer 9, to be described later, becomes a layer of the same material in order not to degrade the quality of crystal to be regrown. Therefore, it is preferable that the cap layer 8 has the same composition as that of the material of the light guide layer. Here, the first conductive type light guide layer 4, active layer 5, and second conductive type light guide layer 6 form an active region layer 15.

Figure 2B:
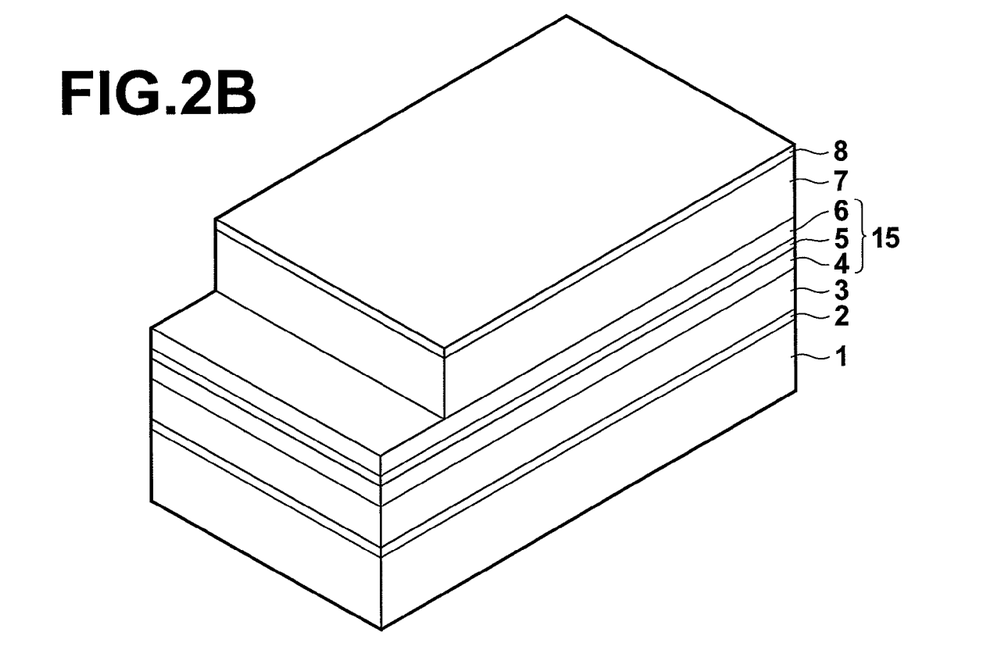
FIG. 2B is a perspective view of the semiconductor light emitting device according to a first embodiment, illustrating a manufacturing process thereof (part 2).

An $SiO_2$ dielectric mask is formed on the second conductive type cap layer 8, and the cap layer 8 and clad layer 7 is removed by wet etching in the emission end face adjacent area (second step), as illustrated in FIG. 2B. In FIG. 2A, the emission end face adjacent area to be removed is illustrated by hatched lines with respect to resonator length L, which is the region from the end face to inward of the device by a predetermined distance L1. Whereas the resonance length L is about 0.5 to 2.0 mm, the length L1 is about 20 to 50 μm.

Figure 2C:
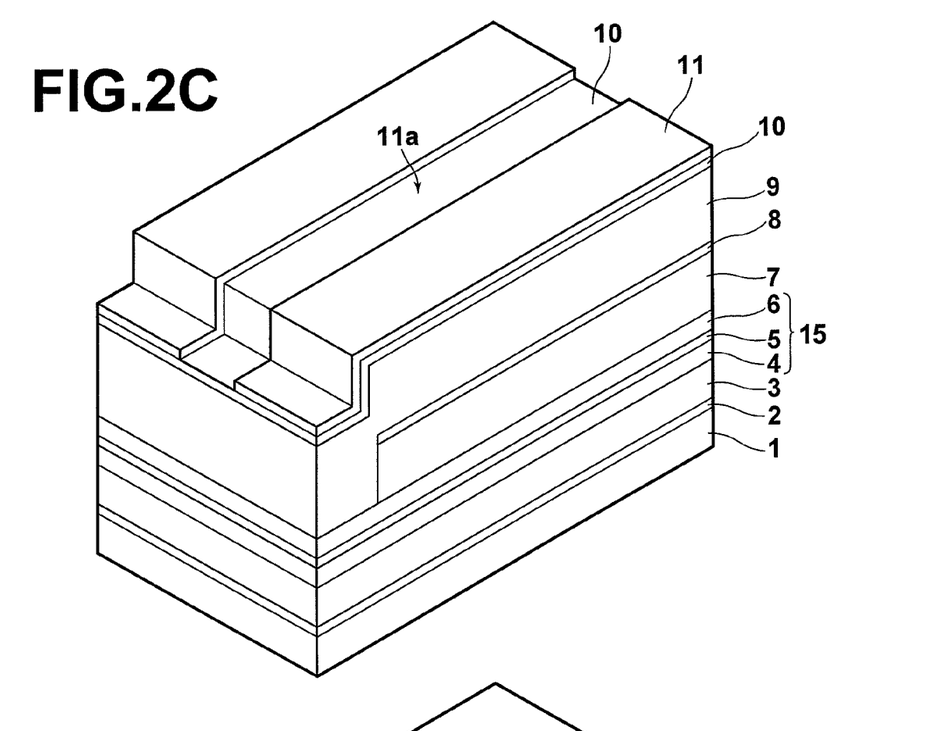
FIG. 2C is a perspective view of the semiconductor light emitting device according to a first embodiment, illustrating a manufacturing process thereof (part 3).

After the etching, the $SiO_2$ mask is removed, and an $Al_{x7}Ga_{1-x7}As$ second conductive type regrowth layer 9 having a higher refractive index than the second conductive type clad layer and a second conductive type contact layer 10 are formed by a second crystal growth (third step), as illustrated in FIG. 2C. Further, an $SiO_2$ film 11 is formed on the contact layer 10, and a portion of the $SiO_2$ film 11 corresponding to a stripe area of about 1 to 200 μm is removed in the (011) direction by ordinary lithography.

Figure 2D:
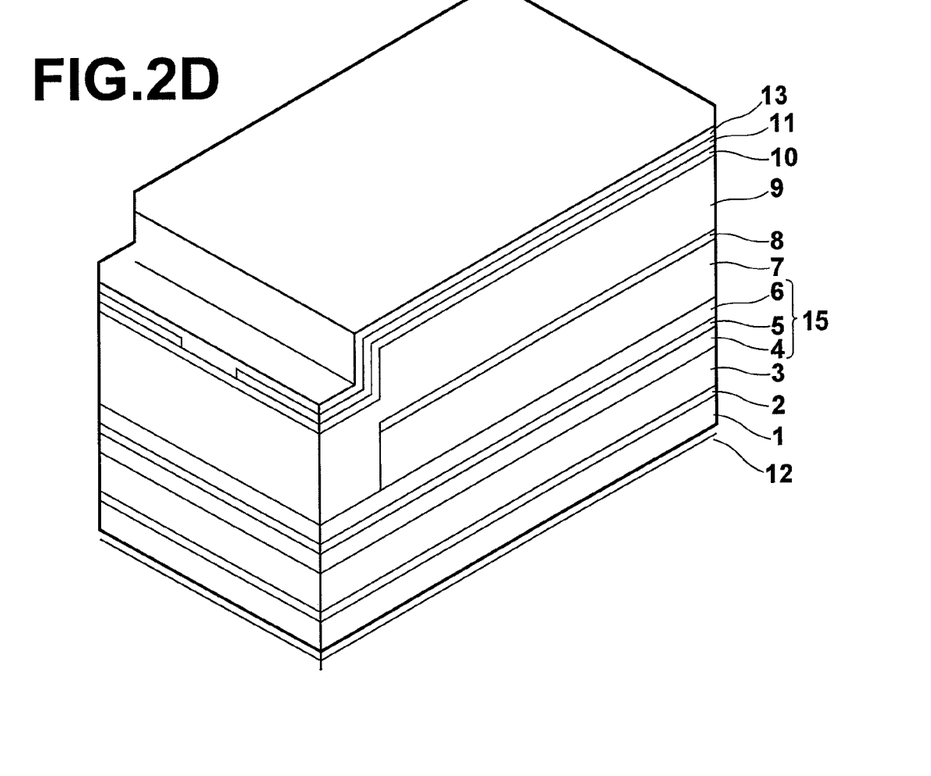
FIG. 2D is a perspective view of the semiconductor light emitting device according to the first embodiment.

Thereafter, the substrate 1 is ground until the overall thickness becomes about 100 μm, and finally an electrode 12 and an electrode 13 are formed on the bottom surface of the substrate 1 and on the contact layer 10 respectively by vapor deposition and heat treatment, as shown in FIG. 2D. An LD bar with a resonator length of about 0.50 to 2.0 mm is cut out by cleavage from the stacked semiconductor sample. Then, a high reflection film is coated on one of the two opposite resonator faces, and a low reflection film is coated on the other face which will become the emission end face. Then, the LD bar is made into a chip by further cleavage and is mounted on a heat sink as a semiconductor light emitting device. Here, the semiconductor light emitting device is mounted on the heat sink with the p-n junction having the emission region facing downward in order to enhance heat dissipation effect.

The composition and thickness of each semiconductor layer stacked on the substrate are set so as not to exceed the critical thickness. The value of z in the layer of $(Al_{x1}Ga_{1-x1})_zIn_{1-z}P$ ($0 \leq x1 \leq 0.7$) is generally set to about 0.49. With respect to the $In_{x3}Ga_{1-x3}As_{1-y3}P_{y3}$ (x3=0.49y3, $0 \leq x3 \leq 0.3$) light guide layer 4 and $In_{x5}Ga_{1-x5}As_{1-y5}P_{y5}$ (x5=0.49y5, $0 \leq x5 \leq 0.3$) light guide layer 6, the element ratio of x3 and x5 may be changed within a range that does not exceed the critical thickness of each layer.

Preferably, the combination of the materials of the second conductive type clad layer and light guide layer is selected so that when wet etching is performed on the second conductive type clad layer, the etching is stopped just above the light guide layer. Alternatively, an etching stop layer may be provided between the second conductive type clad layer and light guide layer.

The oscillation wavelength λ of the semiconductor light emitting device of the present embodiment may be controlled within a range of 900<λ<1200 nm by changing the element ratio of the $In_{x4}Ga_{1-x4}As_{1-y4}P_{y4}$ ($0 \leq x4 \leq 0.1$) active layer. For the growth method of each layer, molecular beam epitaxial method using a solid or gas material may be used.

In the present embodiment, the high and low reflection coatings are provided on the cleaved end faces respectively. But a non-reflective coating may be provided on each of the cleaved end faces to produce a semiconductor light emitting device, such as a superluminescent diode (SLD) in which laser oscillation does not occur, a semiconductor optical amplifier (SOA), or the like.

Figure 3:
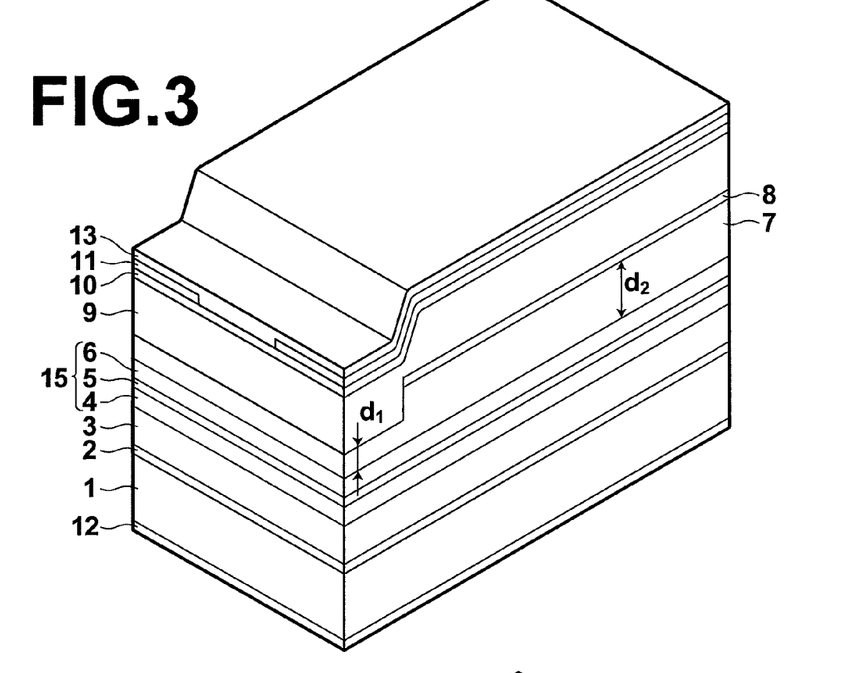
FIG. 3 illustrates a modification of the semiconductor light emitting device according to the first embodiment (part 1).
Figure 4:
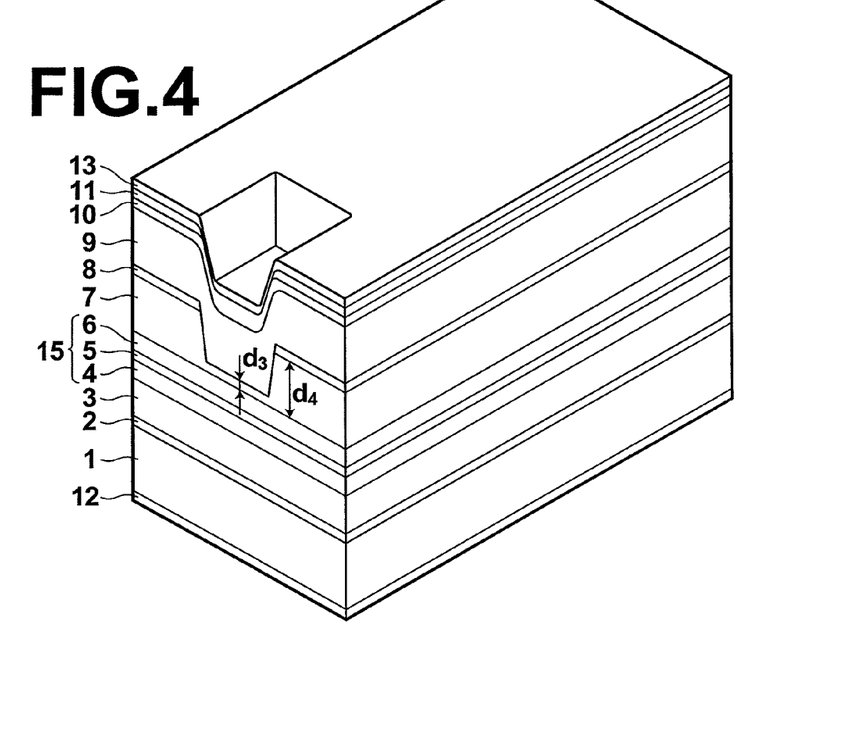
FIG. 4 illustrates a modification of the semiconductor light emitting device according to the first embodiment (part 2).

FIGS. 3 and 4 are perspective views illustrating a modification of the first embodiment. Layers identical to those of the first embodiment are given the same reference numerals.

In the semiconductor light emitting device of the first embodiment, the second conductive type clad layer in the emission end face adjacent area extending from the emission end face to inward of the device by a predetermined distance is all removed and the second conductive type clad layer is stacked on the active region layer other than in the emission end face adjacent area. Alternatively, as in a modification of the semiconductor light emitting device shown in FIG. 3, the second conductive type clad layer may be formed such that a thickness d1 of a portion thereof in the emission end face adjacent area becomes thinner than a thickness d2 of the other portion.

Further, as in another modification of the semiconductor light emitting device shown in FIG. 4, the second conductive type clad layer 7 may be stacked such that a thickness d3 of a portion thereof over an emission region of the active layer 5 in the emission end face adjacent area becomes thinner than a thickness d4 of the other portion. Although the second conductive type clad layer 7 is present on a portion of the active region layer over the emission region in FIG. 4, the second conductive type clad layer 7 may be formed so as not to be present over the emission region by removing the clad layer 7 entirely from the portion.

In each of the embodiments described above, the description has been made of a case in which either one of the resonator end faces is used as the emission end face, and the second conductive type clad layer is formed such that at least a portion thereof is removed in the emission end face adjacent area. Where a resonator is structured to use rear output light or the like, it is preferable that at least a portion of the second conductive type clad layer is removed in the adjacent area of each of the emission end faces.

In any of the aforementioned structures, on a portion of the active region layer at least over the emission region thereof in the emission end face adjacent area, the second conductive type clad layer is not present or the thickness thereof is thinner than in the other portion, so that the regrowth layer 9 is disposed closer to the active region in comparison with the other portion. The regrowth layer 9 has a higher refractive index than the second conductive type clad layer, which enlarges the light emission region (beam spot diameter) at the light output face and reduces the optical power density, so that end face destruction may be prevented even when the output power is high.

A specific example of layer composition (composition and thickness) of each layer of the semiconductor light emitting device according to the first embodiment will be described below. In the following, same reference numerals are given to the layers corresponding to those in the first embodiment.

The specific example includes: an n-type GaAs substrate 1; an n-type GaAS buffer layer (thickness of 0.2 μm, carrier density of $7.0 \times 10^{17}$ cm$^{-3}$) 2; a non-doped or n-type GaAs light guide layer (thickness of 660 Å) 4; an InGaAs quantum well active layer (oscillation wavelength of 1.0 μm, thickness of 70 Å) 5; a non-doped or p-type GaAs light guide layer (thickness of 660 Å) 6; a p-type In$_{0.49}$Ga$_{0.51}$P upper clad layer (thickness of 1.5 μm, carrier density of $7.0 \times 10^{17}$ cm$^{-3}$) 7; a p-type GaAs cap layer (thickness of 100 Å, carrier density of $7.0 \times 10^{17}$ cm$^{-3}$) 8; an Al0.35Ga0.65As regrowth layer (thickness of 1.5 μm, carrier density of $7.0 \times 10^{17}$ cm$^{-3}$) 9; and p$^+$-type GaAs contact layer (thickness of 0.2 μm, carrier density of $7.0 \times 10^{17}$ cm$^{-3}$) 10. These layers may be crystal-grown with a growth temperature in the range from 550 to 700° C. and a growth pressure of 10.3 kPa.

In the aforementioned layer structure, when the entire or a portion of the p-type GaInP clad layer 7 is removed by wet etching, the etching may be stopped just above the GaAs light guide layer using a hydrochloric acid etchant. When stopping the etching in the middle of the clad layer, it is preferable that a GaAs or InGaAsP layer with a thickness of about 100 Å is inserted in the clad layer as an etching stop layer.

Here, the GaAs substrate 1 is described as an n-type conductivity substrate, but a p-type conductivity substrate may also be used, and if that is the case, the conductivity of all of the layers is reversed.

In the semiconductor light emitting device of the first embodiment, it is difficult to maintain the basic transverse mode oscillation to high output power, since it is not provided with an optical confinement structure in the transverse direction. As a second embodiment of the present invention, a semiconductor light emitting device provided with an optical confinement structure in the transverse direction and is capable of maintaining the basic transverse mode oscillation to high output power will be described with reference to FIGS. 5A and 5B.

The method of manufacturing the semiconductor light emitting device according to the present embodiment is the same as that of the semiconductor light emitting device according to the first embodiment to the second process shown in FIGS. 2A and 2B. Also, the process of stacking a second conductive type regrowth layer 9 by the second crystal growth is the same, but a second conductive type cap layer 21 is grown on the second conductive type regrowth layer 9 in the present embodiment.

Figure 5A:
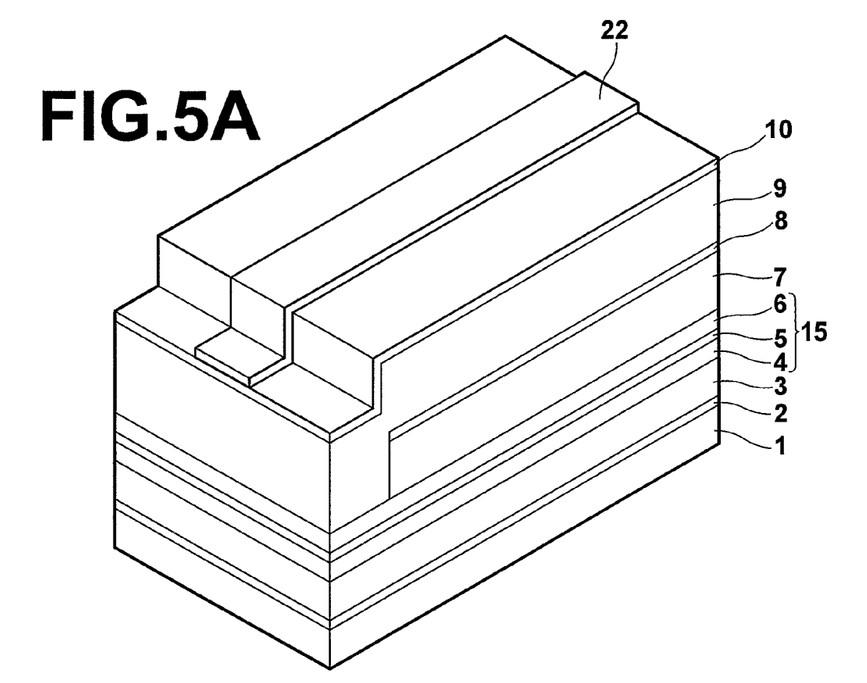
FIG. 5A is a perspective view of the semiconductor light emitting device according to a second embodiment, illustrating a manufacturing process thereof.

Thereafter, as illustrated in FIG. 5A, an SiO$_2$ mask 22 is formed on a stripe region which will become the current injection region, and the area outside the mask is removed to a layer below the active layer (here, to the middle of the first conductive type clad layer) using HBr etchant.

Figure 5B:
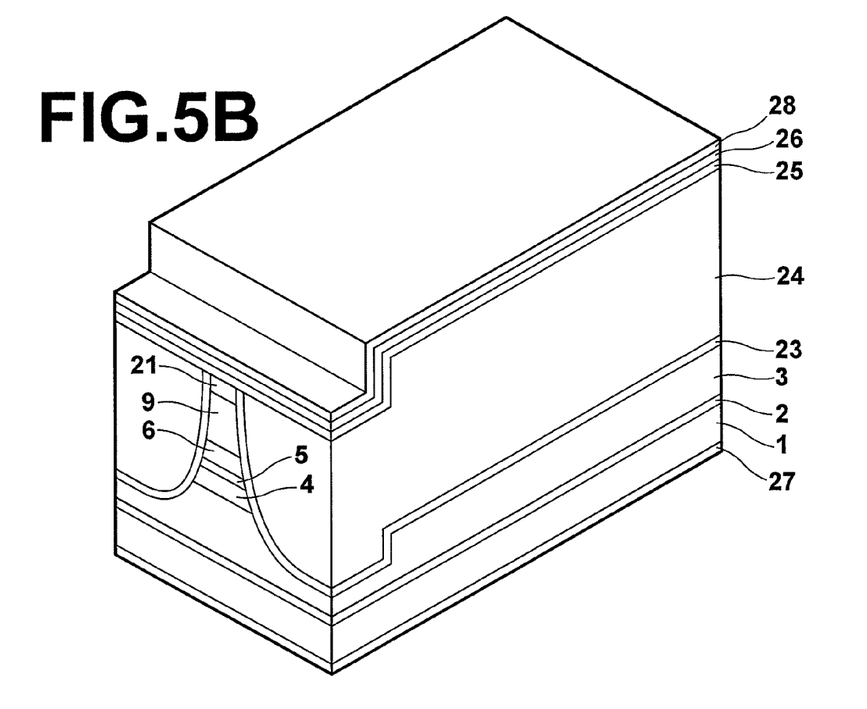
FIG. 5B is a perspective view of the semiconductor light emitting device according to the second embodiment.

Then, as illustrated in FIG. 5B, the region removed by HBr etchant is filled with a second conductive type block layer 23 and a first conductive type block layer 24 grown therein in a third crystal growth. Thereafter, the SiO$_2$ mask 22 is removed and a second conductive type upper clad layer 25 and a second conductive type contact layer 26 are grown by a fourth crystal growth.

Thereafter, the substrate 1 is ground until the overall thickness becomes about 100 μm, and finally an electrode 27 and an electrode 28 are formed on the bottom surface of the substrate 1 and on the contact layer 10 respectively by vapor deposition and heat treatment. An LD bar with a resonator length of about 0.50 to 2.0 mm is cut out by cleavage from the sample. Then, a high reflection film is coated on one of the two opposite resonator faces, and a low reflection film is coated on the other face which will become the emission end face. Then, the LD bar is made into a chip by further cleavage and is mounted on a heat sink as a semiconductor light emitting device. Here, the semiconductor light emitting device is mounted on the heat sink with the p-n junction having the emission region facing downward in order to enhance heat dissipation effect.

The semiconductor light emitting device of the second embodiment is structured to confine light also in the transverse direction in the active layer. Therefore, it may provide an advantageous effect that it can maintain the basic transverse mode oscillation even in high output operation, in addition to the advantageous effects provided by the semiconductor light emitting device of the first embodiment.

A specific example of layer composition (composition and thickness) of each layer of the semiconductor light emitting device according to the second embodiment will be described below. The specific example includes layers 1 to 9 which are identical to those of the specific example of the first embodiment. It further includes: a p-type GaAs cap layer 21 (thickness of 100 Å, carrier density of $7.0 \times 10^{17}$ cm$^{-3}$); a p-type In$_{0.49}$Ga$_{0.51}$P block layer 23; an n-type In$_{0.49}$Ga$_{0.51}$P block layer 24; a p-type Al$_{0.35}$Ga$_{0.65}$As upper clad layer 25 (thickness of 1.0 μm, carrier density of $7.0 \times 10^{17}$ cm$^{-3}$); and a p$^+$-type GaAs contact layer 26 (thickness of 0.2 μm, carrier density of $7.0 \times 10^{17}$ cm$^{-3}$)

What is claimed is:

1. An end face emission type semiconductor light emitting device, comprising:
   a substrate;
   a first conductive type clad layer stacked on the substrate;
   an active region layer including an active layer stacked on the first conductive type clad layer;
   a second conductive type clad layer stacked on the active region layer such that a thickness of a portion thereof at least over an emission region of the active region layer in an emission end face adjacent area is thinner than a thickness of the other portion; and a second conductive type regrowth layer stacked on the second conductive type clad layer, the regrowth layer having a higher refractive index than the second conductive type clad layer.

2. An end face emission type semiconductor light emitting device, comprising:
   a substrate;
   a first conductive type clad layer stacked on the substrate;
   an active region layer including an active layer stacked on the first conductive type clad layer;
   a second conductive type clad layer stacked on the active region layer other than on a portion at least over an emission region thereof in an emission end face adjacent area; and
   a second conductive type regrowth layer stacked on the second conductive type clad layer and on the portion of the active region layer where the second conductive type clad layer is not stacked, the regrowth layer having a higher refractive index than the second conductive type clad layer.

3. The semiconductor light emitting device according to claim 1, wherein:
   the substrate is formed of GaAs;
   the first conductive type clad layer is formed of $(Al_{x1}Ga_{1-x1})_{z1}In_{1-z1}P$ ($0 \leq x1 \leq 0.7$) or $Al_{x2}Ga_{1-x2}As$;
   the active region layer includes, in the order from the side of the first conductive type clad layer, a non-doped or first conductive type $In_{x3}Ga_{1-x3}As_{1-y3}P_{y3}$ light guide layer ($0 \leq x3 \leq 0.3$), an $In_{x4}Ga_{1-x4}As_{1-y4}P_{y4}$ active layer ($0 \leq x4 \leq 0.4$, $0 \leq y4 \leq 0.1$), and a non-doped or second conductive type $In_{x5}Ga_{1-x5}As_{1-y5}P_{y5}$ light guide layer ($0 \leq x5 \leq 0.3$);
   the second conductive type clad layer is formed of $(Al_{x1}Ga_{1-x1})_{z2}In_{1-z2}P$ ($0 \leq x1 \leq 0.7$) or $Al_{x6}Ga_{1-x6}As$; and
   the second conductive type regrowth layer is formed of $Al_{x7}Ga_{1-x7}As$ with an element ratio selected to have a higher refractive index than that of the second conductive type clad layer.

4. The semiconductor light emitting device according to claim 2, wherein:
   the substrate is formed of GaAs;
   the first conductive type clad layer is formed of $(Al_{x1}Ga_{1-x1})_{z1}In_{1-z1}P$ ($0 \leq x1 \leq 0.7$) or $Al_{x2}Ga_{1-x2}As$;
   the active region layer includes, in the order from the side of the first conductive type clad layer, a non-doped or first conductive type $In_{x3}Ga_{1-x3}As_{1-y3}P_{y3}$ light guide layer ($0 \leq x3 \leq 0.3$), an $In_{x4}Ga_{1-x4}As_{1-y4}P_{y4}$ active layer ($0 \leq x4 \leq 0.4$, $0 \leq y4 \leq 0.1$), and a non-doped or second conductive type $In_{x5}Ga_{1-x5}As_{1-y5}P_{y5}$ light guide layer ($0 \leq x5 \leq 0.3$);
   the second conductive type clad layer is formed of $(Al_{x1}Ga_{1-x1})_{z2}In_{1-z2}P$ ($0 \leq x1 \leq 0.7$) or $Al_{x6}Ga_{1-x6}As$; and
   the second conductive type regrowth layer is formed of $Al_{x7}Ga_{1-x7}As$ with an element ratio selected to have a higher refractive index than that of the second conductive type clad layer.

* * * * *